United States Patent
Zhang et al.

(10) Patent No.: US 10,285,302 B1
(45) Date of Patent: May 7, 2019

(54) SUPPORTING BASE AND MOUNTING APPARATUS ADAPTABLE FOR DIFFERENT SERVERS AND ELECTRONIC DEVICE USING THE SAME

(71) Applicant: HONGFUJIN PRECISION ELECTRONICS (TIANJIN) CO., LTD., Tianjin (CN)

(72) Inventors: Ya-Ni Zhang, Tianjin (CN); Dan Sun, Tianjin (CN); Han-Yu Li, New Taipei (TW); Zhao-Hui Zhen, Tianjin (CN)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/016,754

(22) Filed: Jun. 25, 2018

(30) Foreign Application Priority Data

May 18, 2018 (CN) .......................... 2018 1 0485440

(51) Int. Cl.
*H05K 7/18* (2006.01)
*H05K 7/14* (2006.01)
(52) U.S. Cl.
CPC ........... *H05K 7/183* (2013.01); *H05K 7/1489* (2013.01)

(58) Field of Classification Search
CPC .......................... H05K 7/183; H05K 7/1489
See application file for complete search history.

(56) References Cited

U.S. PATENT DOCUMENTS

| | | | |
|---|---|---|---|
| 2002/0158556 A1* | 10/2002 | Cheng | G11B 33/128 312/333 |
| 2008/0217497 A1* | 9/2008 | Yang | H05K 7/1489 248/298.1 |
| 2011/0180497 A1* | 7/2011 | Zhang | G06F 1/188 211/26 |
| 2012/0068031 A1* | 3/2012 | Phelan | H05K 7/1489 248/224.8 |
| 2012/0106079 A1* | 5/2012 | Gomez | H05K 7/1489 361/679.58 |
| 2012/0229971 A1* | 9/2012 | Mills | H05K 7/1489 361/679.46 |
| 2015/0313036 A1* | 10/2015 | Li | H05K 7/1489 312/223.2 |

* cited by examiner

*Primary Examiner* — Nidhi Thaker
(74) *Attorney, Agent, or Firm* — ScienBiziP, P.C.

(57) ABSTRACT

A supporting base for servers of different types and sizes includes two sliding rails and a mounting apparatus. The supporting base includes sliding portions on each side and supporting brackets corresponding to the two sliding portions. When the two supporting brackets are unmounted, the supporting base and sliding rails have a first distance, and when the two supporting brackets are mounted to the two sliding portions, the two sliding rails have a second distance.

16 Claims, 4 Drawing Sheets

100

200

SUPPORTING BASE AND MOUNTING APPARATUS ADAPTABLE FOR DIFFERENT SERVERS AND ELECTRONIC DEVICE USING THE SAME

FIELD

The subject matter herein generally relates to server base.

BACKGROUND

Calculations are no longer the single most important factor for a server. Newer and cheaper types of servers are becoming more popular. An supporting base allowing for the interchangeability of different diameterd servers ought to be available.

Therefore, there is room for improvement within the art.

BRIEF DESCRIPTION OF THE DRAWINGS

Implementations of the present disclosure will now be described, by way of example only, with reference to the attached figures.

DETAILED DESCRIPTION

Figure 1:
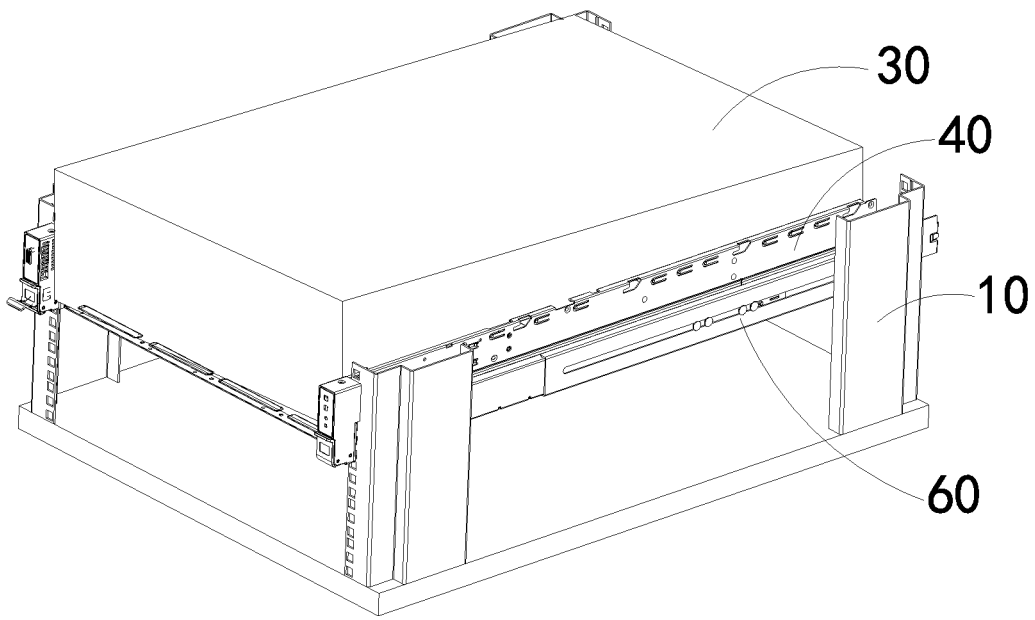
FIG. 1 illustrates an isometric view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "comprising" means "including, but not necessarily limited to"; it specifically indicates open-ended inclusion or membership in a so-described combination, group, series, and the like.

Figure 2:
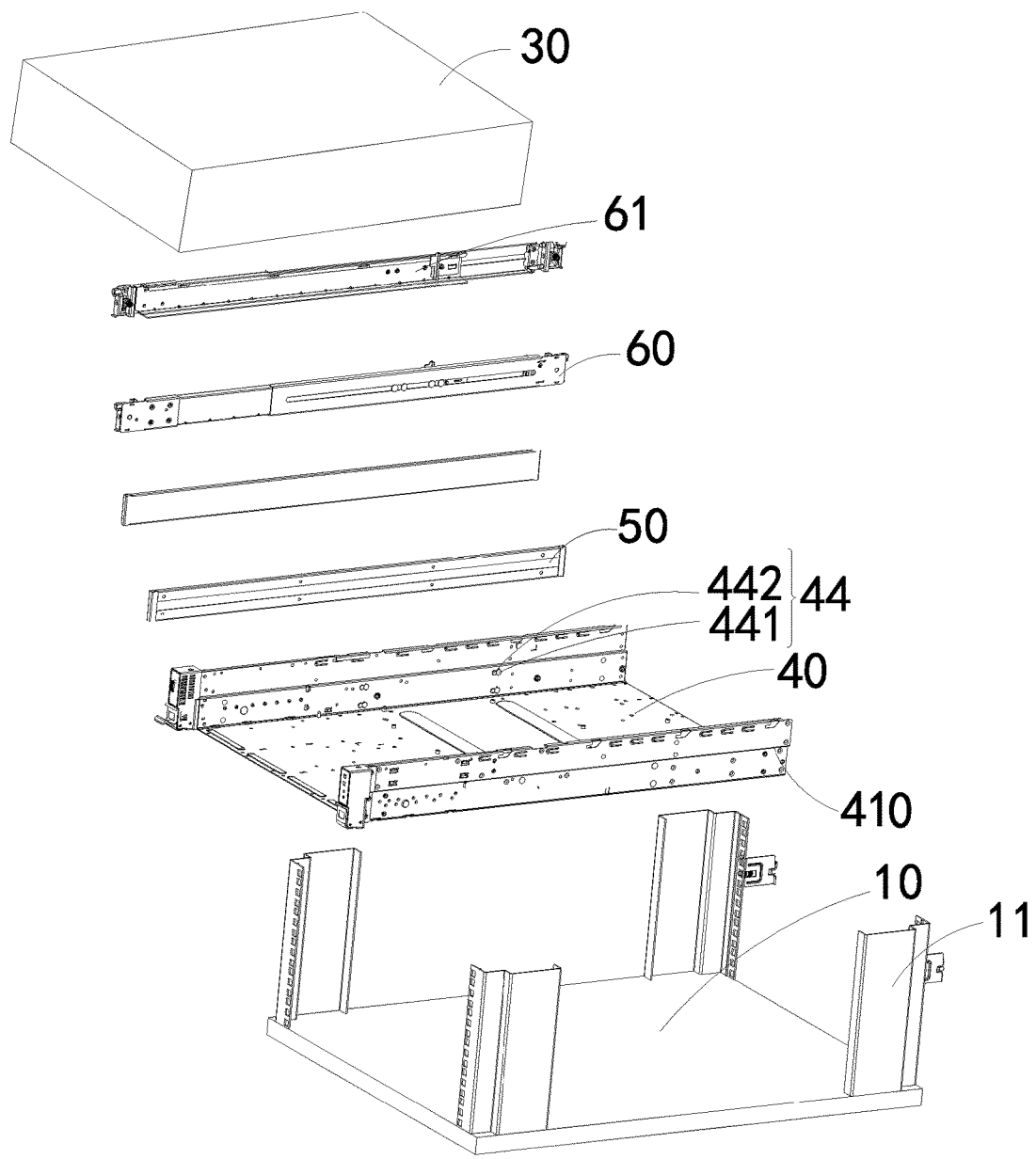
FIG. 2 illustrates an exploded view of the electronic device of FIG. 1.
Figure 3:
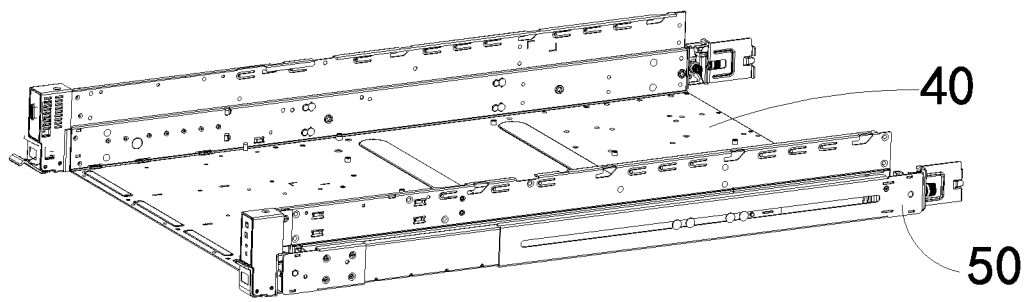
FIG. 3 illustrates an isometric view of the supporting base of the electronic device of FIG. 1.
Figure 4:
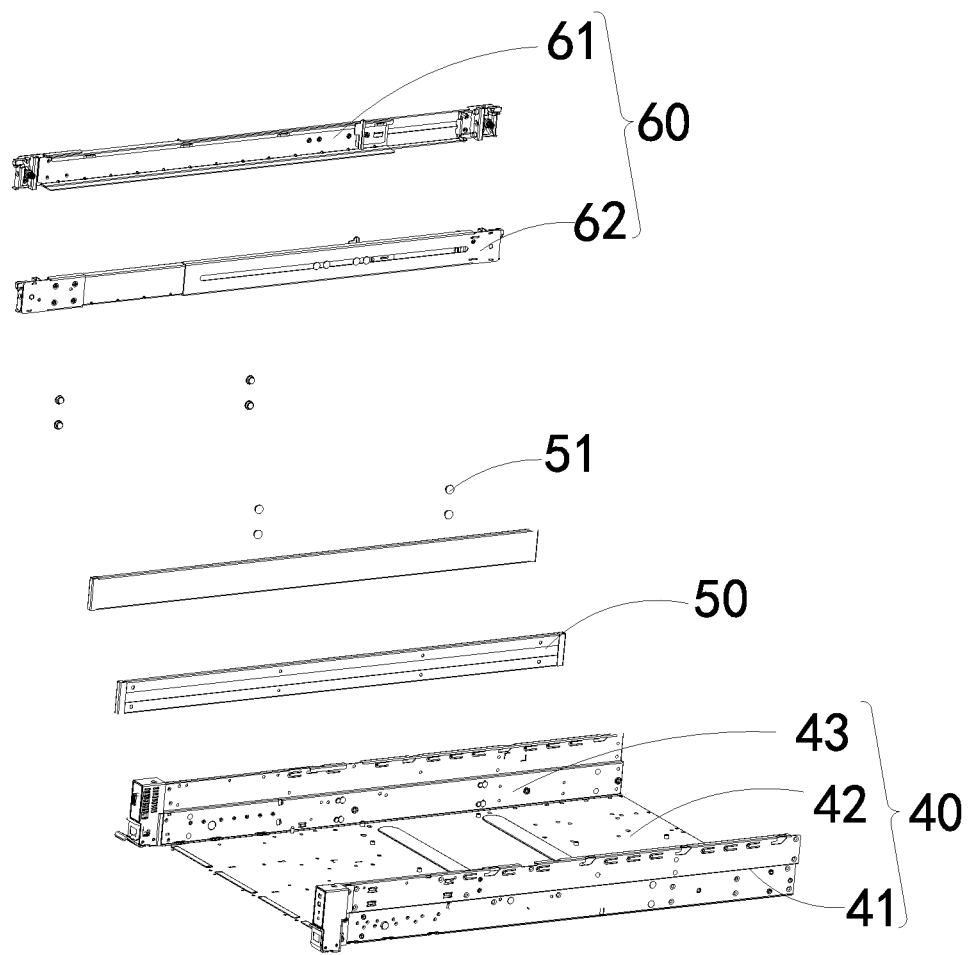
FIG. 4 illustrates an isometric view of the mounting apparatus of the electronic device of FIG. 1.

FIGS. 1 and 2 show an electronic device 100. The electronic device 100 includes an insertable unit 30 and a mounting apparatus 300. The insertable unit 30 can be removably mounted in the mounting apparatus 300. For example, the mounting unit 300 can be a server casing and the insertable unit 30 can be a server unit.

The mounting apparatus 300 includes two sliding rails 60 and a supporting base 200.

The two sliding rails 60 are parallel and adjacent to each other.

The supporting base 200 is used to support the insertable unit 30 and slidably install the insertable unit 30 to the two sliding rails 60.

The supporting base 200 includes a chassis 40 and two supporting brackets 50.

The chassis 40 defines two sliding portions 410, the sliding portions 410 are defined on opposite sides of the chassis 40. The two supporting brackets 50 respectively correspond to the two sliding portions 410.

The two supporting brackets 50 are selectively and detachably mounted to the two sliding portions 410.

When the two supporting brackets 50 are unmounted, the supporting base 200 can receive two sliding rails 60 with a first distance between them.

When the two supporting brackets 50 are mounted to the two sliding portions 410, the supporting base 200 can receive two sliding rails 60 with a second distance through the two supporting brackets 50.

The two sliding portions 410 can be sliding grooves defined on opposite surfaces of the chassis 40, and the sliding grooves extend along an installation direction of the insertable unit 30.

The supporting base 40 can further include a plurality of screws 51 and a plurality of mounting holes 44 corresponding to the screws 51. The mounting holes 44 are defined on opposite sides of the chassis 40.

The supporting brackets 50 are mounted to the chassis 40 using the screws 51 and the mounting holes 44.

For example, each of the mounting holes 44 can include a first through hole 441 and a second through hole 442 interconnected with the first through hole 441. The diameter of the first through hole 441 is larger than the diameter of the second through hole 442. Each of the screws 51 can include a threaded rod mounted to a mounting bracket 50 and a nut fixed to the free end of the threaded rod.

The nut for the screw 51 passes through the first through hole 441 and the screw 51 slides within the second through hole 442. The nut resists on a side surface of the chassis 40 and mounts the mounting bracket 50 to the chassis 40.

The chassis 40 can include a bottom plate 42 and side plates 41 perpendicularly connected to opposite sides of the bottom plate 42.

The bottom plate 42 with the two side plates 41 define an receiving space 43 for receiving the insertable unit 30.

The sliding portions 410 are defined on sides of the side plates 41.

Each of the two sliding rails 60 can include an outer rail 62 and an inner rail 61 slidably mounted to the outer rail 62. The supporting base 200 is mounted to the inner rails 61.

The electronic device 100 can further include a base plate 10 and at least two supporting legs 11. The supporting legs 11 are perpendicularly and adjacently connected to a side of the base plate 10. The outer rails 62 of the two sliding rails are mounted to the supporting legs 11.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A supporting base for supporting an insertable unit and slidably installing the insertable unit to two sliding rails parallel and adjacent to each other, comprising: a chassis defining two sliding portions respectively on two opposite sides of the chassis; and two supporting brackets respectively corresponding to the two sliding portions; wherein the two supporting brackets are selectively and detachably mounted to the two sliding portions; and: when the two supporting brackets are not mounted to the two sliding portions, the supporting base is installed to two sliding rails with a first distance through the two sliding portions, and when the two supporting brackets are mounted to the two sliding portions, the supporting base is installed to two sliding rails with a second distance through the two supporting brackets; wherein the supporting base further comprises: a plurality of screws; and mounting holes defined on the opposite sides of the chassis and corresponding to the screws; and wherein the supporting brackets are directly mounted to the chassis by the screws and the mounting holes.

2. The supporting base of claim 1, wherein the two sliding portions are two sliding grooves respectively defined on two opposite surfaces of the chassis, and the sliding grooves extend along an installation direction of the insertable unit.

3. The supporting base of claim 1, wherein each of the mounting holes comprises: a first through hole; and a second through hole interconnected with the first through hole; wherein the diameter of the first through hole is larger than the diameter of the second through hole; each of the screws comprises: a threaded rod mounted to a mounting bracket; and a nut fixed to the free end of the threaded rod; wherein the nut of the screw passes through the first through hole and the screw slides to the second through hole, the nut resists on a side surface of the chassis and mounts the mounting bracket to the chassis.

4. A mounting apparatus comprising: two sliding rails parallel and adjacent to each other; and a supporting base for supporting an insertable unit and slidably installing the insertable unit to the two sliding rails, comprising: a chassis defining two sliding portions respectively on opposite sides of the chassis; and two supporting brackets respectively corresponding to the two sliding portions; wherein the two supporting brackets are selectively attachably and detachably mounted to the two sliding portions; and when the two supporting brackets are not mounted to the two sliding portions, the supporting base is installed to two sliding rails with a first distance through the two sliding portions; and when the two supporting brackets are mounted to the two sliding portions, the supporting base is installed to two sliding rails with a second distance through the two supporting brackets; wherein the supporting base further comprises: a plurality of screws; and mounting holes defined on the two opposite sides of the chassis and corresponding to the screws; and wherein the supporting brackets are directly mounted to the chassis by the screws and the mounting holes.

5. The mounting apparatus of claim 4, wherein the two sliding portions are two sliding grooves respectively defined on two opposite surfaces of the chassis, and the sliding grooves extend along an installation direction of the insertable unit.

6. The mounting apparatus of claim 4, wherein each of the mounting holes comprises: a first through hole; and a second through hole interconnected with the first through hole; wherein the diameter of the first through hole is larger than the diameter of the second through hole; each of the screws comprises: a threaded rod mounted to a mounting bracket; and a nut fixed to the free end of the threaded rod; wherein the nut of the screw passes through the first through hole and the screw slides through the second through hole, the nut resists on a side surface of the chassis and mounts the mounting bracket to the chassis.

7. The mounting apparatus of claim 4, wherein the chassis comprises:
a bottom plate; and
two side plates perpendicularly and respectively connected to opposite sides of the bottom plate;
wherein the bottom plate and the two side plates together define an receiving space for receiving the insertable unit.

8. The mounting apparatus of claim 4, wherein the two sliding portions are respectively defined on peripheral sides of the two side plates.

9. The mounting apparatus of claim 4, wherein each of the two sliding rails comprises:
an outer rail; and
an inner rail slidably mounted to the outer rail;
wherein the supporting base is mounted to the inner rails.

10. An electronic device comprising: an insertable unit; and a mounting apparatus comprising: two sliding rails parallel and adjacent to each other; and a supporting base for supporting the insertable unit and slidably installing the insertable unit to the two sliding rails, comprising: a chassis defining two sliding portions respectively on opposite sides of the chassis; and two supporting brackets respectively corresponding to the two sliding portions; wherein the two supporting brackets are selectively attachably and detachably mounted to the two sliding portions; and when the two supporting brackets are not mounted to the two sliding portions, the supporting base is installed to two sliding rails with a first distance through the two sliding portions, and when the two supporting brackets are mounted to the two sliding portions, the supporting base is installed to two sliding rails with a second distance through the two supporting brackets; wherein the supporting base further comprises: a plurality of screws; and mounting holes defined on the two opposite sides of the chassis and corresponding to the screws; and wherein the supporting brackets are directly mounted to the chassis by the screws and the mounting holes.

11. The electronic device of claim 10, wherein the two sliding portions are two sliding grooves respectively defined on opposite surfaces of the chassis, and the sliding grooves extend along an installation direction of the insertable unit.

12. The electronic device of claim 10, wherein each of the mounting holes comprises: a first through hole; and a second through hole interconnected with the first through hole; wherein the diameter of the first through hole is larger than the diameter of the second through hole; each of the screws comprises: a threaded rod mounted to a mounting bracket; and a nut fixed to the free end of the threaded rod; wherein the nut of the screw passes through the first through hole and the screw slides to the second through hole, the nut resists on a side surface of the chassis and mounts the mounting bracket to the chassis.

13. The electronic device of claim 10, wherein the chassis comprises:
a bottom plate; and
two side plates perpendicularly and respectively connected to opposite sides of the bottom plate;
wherein the bottom plate and the two side plates together define an receiving space for receiving the insertable unit.

14. The electronic device of claim 10, wherein the two sliding portions are respectively defined on peripheral sides of the two side plates.

15. The electronic device of claim 10, wherein each of the two sliding rails comprises:
   an outer rail; and
   an inner rail slidably mounted to the outer rail;
   wherein the supporting base is mounted to the inner rails.

16. The electronic device of claim 10, wherein the electronic device further comprises:
   a base plate; and
   two supporting legs perpendicularly and adjacently connected to a side of the base plate;
   wherein the two sliding rails are respectively mounted to the two supporting legs.

\* \* \* \* \*